United States Patent
Rana et al.

(10) Patent No.: US 8,116,153 B2
(45) Date of Patent: Feb. 14, 2012

(54) READ ONLY MEMORY AND METHOD OF READING SAME

(75) Inventors: Manmohan Rana, Ghaziabad (IN); Bikas Maiti, Austin, TX (US); Ashish Sharma, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 273 days.

(21) Appl. No.: 12/687,847

(22) Filed: Jan. 14, 2010

(65) Prior Publication Data

US 2010/0208506 A1 Aug. 19, 2010

(30) Foreign Application Priority Data

Feb. 17, 2009 (IN) .............................. 304/DEL/2009

(51) Int. Cl.
*G11C 7/00* (2006.01)
(52) U.S. Cl. ............... 365/189.16; 365/189.02; 365/203; 365/204
(58) Field of Classification Search ............. 365/189.16, 365/203, 204, 189.02, 189.14
See application file for complete search history.

(56) References Cited

U.S. PATENT DOCUMENTS

| | | | |
|---|---|---|---|
| 4,443,718 A | 4/1984 | Hagiwara et al. | |
| 4,899,308 A | 2/1990 | Khan | |
| 5,363,338 A | 11/1994 | Oh | |
| 5,903,171 A | 5/1999 | Shieh | |
| 6,151,269 A * | 11/2000 | Dosaka et al. | 365/189.17 |
| 6,240,046 B1 * | 5/2001 | Proebsting | 365/233.17 |
| 6,373,753 B1 * | 4/2002 | Proebsting | 365/189.09 |
| 7,002,827 B1 | 2/2006 | Sabharwal et al. | |
| 7,035,129 B1 | 4/2006 | Khanuja | |

OTHER PUBLICATIONS

Fang-Shi Lai & Chia-Fu Lee, "On-Chip Voltage Down Converter to Improve SRAM Read/Write Margin and Static Power for Sub-Nano CMOS Technology", IEEE Journal of Solid-State Circuits, vol. 42, No. 9, Sep. 2007.

* cited by examiner

*Primary Examiner* — Son Dinh
(74) *Attorney, Agent, or Firm* — Charles Bergere

(57) ABSTRACT

A Read Only Memory (ROM) device includes a ROM array, a row address decoder, a column address decoder, a column multiplexer, and a control circuit. Data is stored in bit cells in the ROM array. The control circuit generates control signals for reading the ROM. The row address decoder selects a word line. The column address decoder enables a bit line. The data is sensed from a bit cell corresponding to the selected word line and the enabled bit line by a corresponding sense amplifier and delivered on a data output pin of the ROM. The control signals for enabling the bit line and the sense amplifier operate at a higher voltage than supply voltage of the ROM. This reduces the ROM read time.

19 Claims, 4 Drawing Sheets

READ ONLY MEMORY AND METHOD OF READING SAME

BACKGROUND OF THE INVENTION

The present invention relates to Read Only Memory (ROM) devices and more particularly to optimizing the read time of a low voltage ROM device.

A ROM device includes a ROM array including a plurality of bit line columns and a plurality of word lines. Each of the bit line columns is connected to a plurality of bit lines. Each of the bit line columns includes a plurality of bit cells. The bit cells are connected to the bit lines and the word lines. The bit cells store binary data. The bit line columns are connected to one or more column multiplexers. The column multiplexers are further connected to one or more sense amplifiers. The bit lines are pre-charged by a pull-up bit line signal and the data stored in the bit cells is read by the one or more sense amplifiers. Further, the bit lines are discharged by a pull-down bit line signal.

Presently, there is a desire that electronic devices consume less power, so there is a demand for electronic devices that operate at lower power levels. For ROM devices, operating at low voltage decreases operating frequency. This reduction in the operating frequency increases the data read time, which degrades performance.

It would be advantageous to have a ROM device with an improved read time when the ROM is operating at a low supply voltage.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
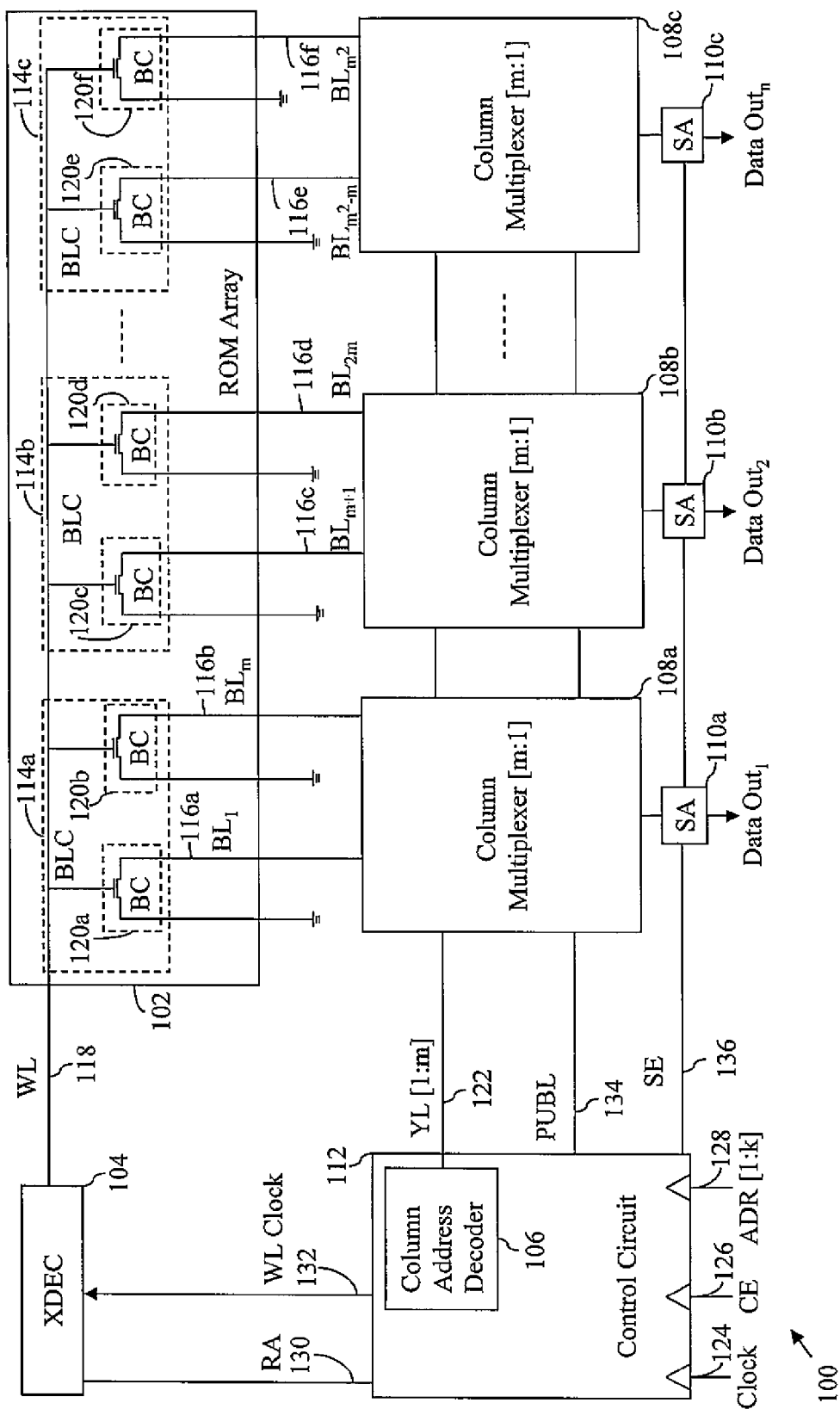
FIG. 1 is a schematic block diagram illustrating a Read Only Memory (ROM) device in accordance with an embodiment of the present invention.

The detailed description of the appended drawings is intended as a description of the currently preferred embodiments of the present invention, and is not intended to represent the only form in which the present invention is practiced. It is to be understood that the same or equivalent functions is accomplished by different embodiments that are intended to be encompassed within the spirit and scope of the present invention.

In an embodiment of the present invention, a Read Only Memory (ROM) device that operates at a low supply voltage is provided. The ROM device includes a ROM array that has a plurality of bit line columns. Each of the bit line columns is connected to a plurality of bit lines. The bit lines operate at the (low) supply voltage. Each of the bit line columns includes a plurality of bit cells. A gate terminal of each of the bit cells is connected to a plurality of word lines. The word lines operate at a level-shifted voltage. The level-shifted voltage is higher than the supply voltage. A row address decoder is connected to the ROM array. The row address decoder selects at least one of the word lines for a read operation. A column address decoder is connected to the plurality of bit lines. The column address decoder generates a column address signal for enabling at least one of the bit lines. The column address signal operates at the level shifted voltage. One or more sense amplifiers are connected to the plurality of bit lines and sense the data on the bit lines. One or more column multiplexers are connected to the plurality of bit line columns. The column multiplexers include a plurality of transmission gates connected to the plurality of bit lines. The transmission gates transfer data stored in the bit cells to the sense amplifiers. The column address signal is supplied to a gate terminal of an n-channel metal oxide semiconductor field effect transistor (n-MOSFET) of the plurality of transmission gates. An inverter circuit, included in each of the one or more column multiplexers, receives the column address signal and generates a pull-down bit line signal to discharge the at least one enabled bit line. The pull-down bit line signal operates at the level-shifted voltage. A control circuit is connected to each of the row address decoders, the one or more column multiplexers, and the one or more sense amplifiers. The control circuit generates a pull-up bit line signal for pre-charging the plurality of bit lines, and a sense amplifier enable signal to enable the one or more sense amplifiers to perform a read operation. Both the pull-up bit line signal and the sense amplifier enable signal operate at the level-shifted voltage.

In another embodiment of the present invention, a Read Only Memory (ROM) device that operates at a low supply voltage is provided. The ROM device includes a ROM array having a plurality of bit line columns. The bit lines columns are connected to a plurality of bit lines. The bit lines operate at the (low) supply voltage. Each of the plurality of bit line columns includes a plurality of bit cells. A gate terminal of each of the plurality of bit cells is connected to a plurality of word lines. The word lines operate at a level shifted voltage. The level shifted voltage is higher than the supply voltage. A row address decoder is connected to the ROM array. The row address decoder selects at least one of the plurality of word lines for a read operation. A column address decoder is connected to the plurality of bit lines. The column address decoder generates a column address signal to enable at least one of the bit lines for the read operation. The column address signal operates at the level shifted voltage. One or more sense amplifiers are connected to the plurality of bit lines. The sense amplifiers sense the plurality of bit lines. One or more column multiplexers are connected to the plurality of bit line columns. The column multiplexers include a plurality of transmission gates. The plurality of transmission gates are connected to the plurality of bit lines for transferring data stored in the bit cells to the sense amplifiers. The column address signal is supplied to a gate terminal of an n-channel metal oxide semiconductor field effect transistor (n-MOSFET) of the plurality of transmission gates. An inverter circuit receives the column address signal and generates a pull-down bit line signal. The pull-down bit line signal discharges the at least one enabled bit line. A control circuit is connected to each of the row address decoder, the one or more column multiplexers, and the one or more sense amplifiers. The control circuit generates a pull-up bit line signal for pre-charging the plurality of bit lines. The control circuit also generates a sense amplifier enable signal for enabling the one or more sense amplifiers for the read operation.

In yet another embodiment of the present invention, a method for operating a Read Only Memory (ROM) device that operates a low supply voltage is provided. The ROM array includes a plurality of bit line columns that are connected to a plurality of bit lines. The plurality of bit lines operate at the (low) supply voltage. Each of the plurality of bit line columns includes a plurality of bit cells. A gate terminal of each of the plurality of bit cells is connected to a plurality of word lines. The word lines operate at a level shifted voltage that is higher than the supply voltage. A read operation of the ROM device begins with the generation of a column address signal to enable at least one of the bit lines. The column address signal operates at the level shifted voltage. Thereafter, a pull-up bit line signal is generated for pre-charging the plurality of bit lines. The pull-up bit line signal also operates at the level shifted voltage. When the plurality of bit lines are pre-charged to a first predefined threshold voltage, the control circuit disables the pull-up bit line signal. In an embodiment of the present invention, the first predefined threshold voltage is 95% of the supply voltage. Thereafter, a row address signal is generated for selecting at least one of the plurality of word lines. For the read operation, a sense amplifier associated with each of the plurality of bit lines is enabled by a sense amplifier enable signal. The sense amplifier enable signal operates at the level shifted voltage. Subsequently, a pull-down bit line signal is generated by disabling the column address signal. The pull-down bit line signal enables a discharge of the enabled one of the plurality of bit lines. The pull-down bit line signal operates at the level shifted voltage. Finally, the selected one of the plurality of word lines is disabled by disabling the row address signal.

Embodiments of the present invention provide a ROM device that operates at a low supply voltage yet has a fast read time. In the description that follows, the low supply voltage is also referred to as $V_{DD}$. To reduce the read time, the plurality of word lines operate at a level shifted voltage ($V_{DDA}$). The level-shifted voltage $V_{DDA}$ is higher than $V_{DD}$. Since the plurality of word lines operate at $V_{DDA}$, an increased drive current is provided to the gate terminals of the plurality of bit cells. The increased drive current increases the rate of discharge of the plurality of bit lines. The column address signal also operates at $V_{DDA}$, which helps to increase the drive strength of an n-channel metal oxide field effect transistor (n-MOSFET) of a transmission gate. Hence, the rate of discharge of the plurality of bit lines also increases, which reduces the read time of the ROM device. Further, the pull-up bit line signal and the sense amplifier enable signal operate at $V_{DDA}$. This is required for synchronization of the pull-up bit line signal and the sense amplifier enable signal with the timing of the ROM device. The pull-down bit line signal also operates at $V_{DDA}$, which improves the cycle time of the ROM device. In one embodiment of the invention, the supply voltage $V_{DD}$ is 0.8v and the level-shifted voltage $V_{DDA}$ is 1.0v.

Further, ROM devices are generally well known in the art and thus, although the drawings only show a portion of a ROM device and ROM array thereof, it will be readily understood by those of skill in the art how the inventive concepts disclosed herein apply to ROM devices of various sizes.

Referring now to FIG. 1, a block diagram illustrating a Read Only Memory (ROM) device 100 in accordance with an embodiment of the present invention is shown. The ROM device 100 includes a ROM array 102, a row address decoder (XDEC) 104, a column address decoder 106, a plurality of column multiplexers such as column multiplexers 108a, 108b and 108c, one or more sense amplifiers such as sense amplifiers 110a, 110b and 110c, and a control circuit 112.

The ROM array 102 includes a plurality of bit line columns (BLCs), three of which are shown, BLC 114a, BLC 114b, and BLC 114c. Each of the plurality of BLCs is connected a corresponding one of the plurality of column multiplexers 108a, 108b and 108c by way of a plurality of bit line signals such as bit line signals 116a, 116b, 116c, 116d and 116e, as shown. The BLCs 114a, 114b and 114c are also connected to the XDEC by way of a plurality of word line signals WL, such as word line signal 118. Further, each of the plurality of BLCs 114 includes a plurality of bit cells such as bit cells 120a, 120b, 120c, 120d, 1203 and 120f.

In various embodiments of the present invention, each of the plurality of bit cells 120a-120f is a metal oxide semiconductor field effect transistor (MOSFET). A source terminal of each of the plurality of bit cells 120 is connected to a common ground voltage. The plurality of bit cells 120 store binary data, i.e., logic 0, or logic 1. A drain terminal of each of the plurality of bit cells 120 is connected to a corresponding bit line signal BL when the plurality of bit cells 120 hold a logic 0 value. When the plurality of bit cells 120 hold a logic 1 value, the drain terminal is not connected to the corresponding bit line signal BL. A gate terminal of each of the plurality of bit cells 120 receives input from a corresponding word line signal WL of the plurality of word line signals 118.

The XDEC 104 selects the word line signal WL 118 for a read operation. The column address decoder 106 generates a column address signal (YL [1:m]) 122, which is provided to the one or more column multiplexers 108. The one or more column multiplexers 108 select one of the plurality of BLCs 114. Data stored in the plurality of bit cells 120 corresponding to the selected one of the plurality of BLCs 114 is provided to the one or more sense amplifiers 110. The control circuit 112 receives a clock signal 124, a chip enable (CE) signal 126, and an ADR [1:k] signal 128. The control circuit 112 generates a row address signal. RA 130 to enable the XDEC 104. The control circuit 112 also generates a word line clock signal (WL Clock) 132, and provides the WL Clock 132 to the XDEC 104. Further, the control circuit 112 generates a pull-up bit line (PUBL) signal 134 that is provided to the one or more column multiplexers 108. The control circuit 112 also generates a sense amplifier enable signal SE 136 to enable the one or more sense amplifiers 110.

A read operation of the ROM device 100 is initiated by the CE signal 126. The CE signal 126 enables the ROM device 100. The clock signal 124 initiates the timing cycle for the read operation. A k-bit address indicating the location of the data to be read from the ROM array 102 is provided by the ADR [1:k] signal 128. The control circuit 112 generates the word line clock signal 132 based on the k bit address, and generates a corresponding word line signal of the plurality of word line signals 118. The column address decoder 106 generates the YL [1:m] signal 122 to enable at least one of the plurality of bit line signals 116 in each of the one or more column multiplexers 108. The YL [1:m] signal 122 is an m-bit column address signal. Each of the m-bits of the YL [1:m] signal 122 corresponds to one of the m-bit line signals of the plurality of bit line signals 116, in each of the one or more sense amplifiers 110. Thereafter, the control circuit 112 generates the PUBL signal 134 to pre-charge the plurality of bit line signals 116.

When the plurality of bit line signals 116 are pre-charged to a first predefined threshold voltage, the control circuit 112 stops pre-charging the plurality of bit line signals 116. In an embodiment of the present invention, the first predefined threshold voltage is 95% of $V_{DD}$. Thereafter, the control circuit 112 generates the row address signal 130 based on the ROM address received on the ADR [1:k] signal 128. The row address signal 130 is generated to select the word line signal 118 for the read operation. The one or more sense amplifiers 110 are enabled by the sense amplifier enable signal 136. The one or more sense amplifiers 110 perform the read operation. During the read operation, data stored in the bit cells 120 is sensed by the one or more sense amplifiers 110. The plurality of bit cells 120 store data in the form of bits (logic 1 or logic 0). The data sensed by the one or more sense amplifiers 110 is received at Data Out. Subsequently, the control circuit 112 disables the row address signal 130 and the XDEC 104 disables the word line signal 118. The operation of the ROM device 100 is explained in more detail in conjunction with FIG. 2.

Figure 2:
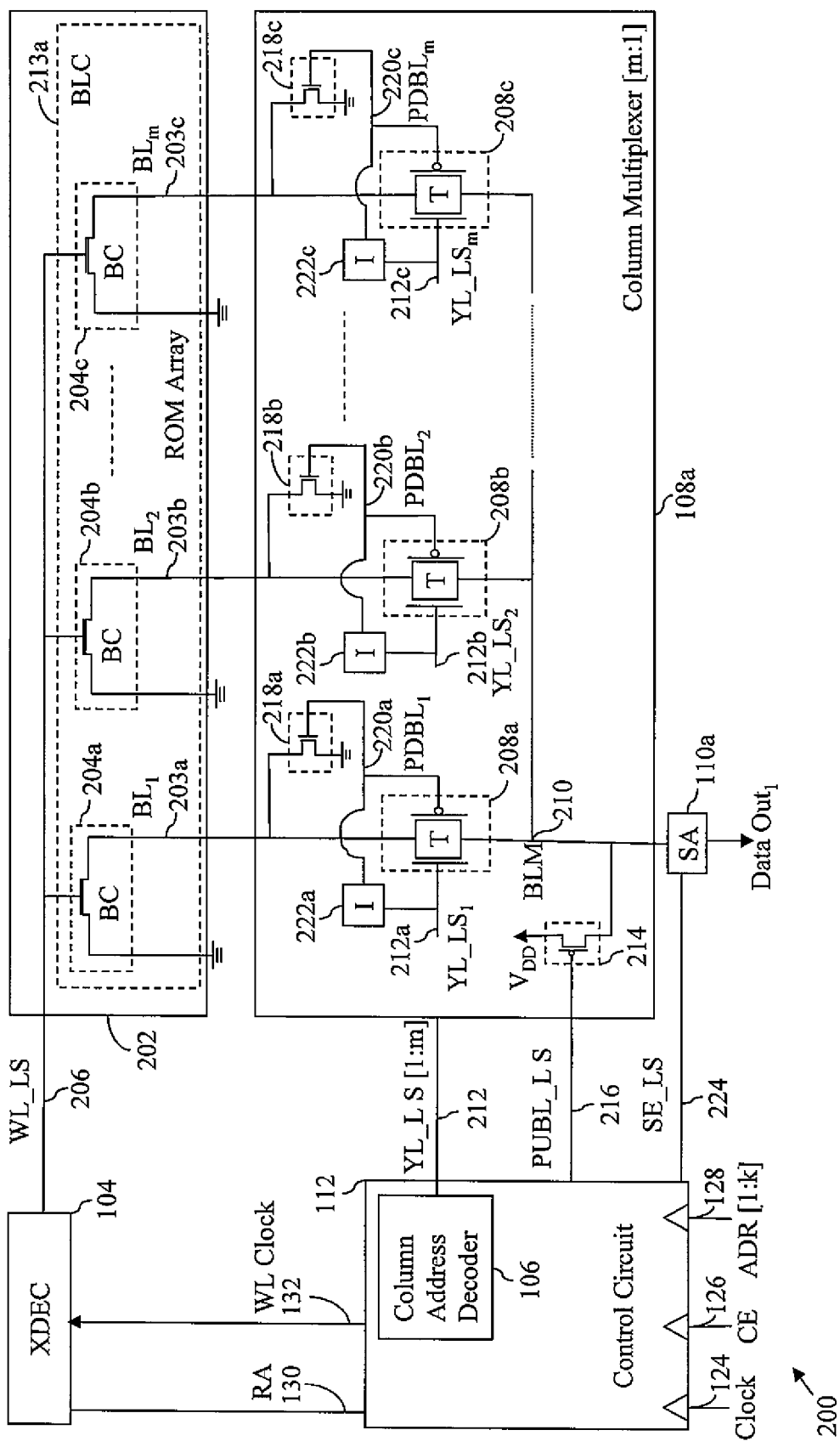
FIG. 2 is a more detailed schematic block diagram of a ROM device in accordance with an embodiment of the present invention.

Referring now to FIG. 2, a more detailed schematic block diagram illustrating a Read Only Memory (ROM) device 200 in accordance with an embodiment of the present invention is shown. The ROM device 200 includes a ROM array 202, the row address decoder (XDEC) 104, the column address decoder 106, the column multiplexer 108a, the sense amplifier 110a and the control circuit 112.

The ROM array 202 includes a bit line column (BLC) 213a. The BLC 213a is connected to a plurality of bit line signals, three of which are shown (203a, 203b and 203c and referred to collectively as 203). The BLC 214a includes a plurality of bit cells, three of which are shown (204a, 204b, and 204c, referred to collectively as 204). The plurality of bit cells 204 store binary data (logic 1 or logic 0).

In various embodiments of the present invention, each of the plurality of bit cells 204 is a metal oxide semiconductor field effect transistor (MOSFET). A source terminal of each of the plurality of bit cells 204 is connected to ground. When the plurality of bit cells 204 store a logic 0 value, a drain terminal of the bit cells 204 is connected to a corresponding bit line signal of the plurality of bit line signals 203. However, when the plurality of bit cells 204 store a logic 1 value, the drain terminal is not connected to the corresponding bit line signal. A gate terminal of each of the bit cells 204 is connected to a plurality of word line (WL_LS) signals 206. The plurality of WL_LS signals 206 are generated by the XDEC 104 on receiving the row address signal 130 and the word line clock signal 132 input from the control circuit 112.

The column multiplexer 108a includes a plurality of complimentary metal oxide semiconductor (CMOS) transmission gates 208 such as transmission gates 208a, 208b and 208c. An input of the plurality of transmission gates 208 is connected to the plurality of bit line signals 203. The plurality of bit line signals 203 operate at the supply voltage $V_{DD}$. An output of the plurality of transmission gates 208 is connected to a BLM node 210. A gate terminal of an n-channel metal oxide semiconductor field effect transistor (n-channel MOSFET) of the plurality of transmission gates 208 receives a YL_LS [1:m] signal 212 as input from the column address decoder 106. The YL_LS [1:m] signal 212 is an m bit column address signal. Each of the m bits of the YL_LS [1:m] signal 212, such as YL_LS$_1$ 212a, YL_LS$_2$ 212b, and YL_LS$_3$ 212c, is supplied to the n-channel MOSFET of a corresponding transmission gate of the plurality of transmission gates 208.

The column multiplexer 108a also includes a pull-up transistor 214 to pre-charge the plurality of bit line signals 203. According to various embodiments of the present invention, the pull-up transistor 214 is a MOSFET that operates at the supply voltage $V_{DD}$. A drain terminal of the pull-up transistor 214 is connected to the BLM node 210. A source terminal of the pull-up transistor 214 is connected to the supply voltage $V_{DD}$. A gate terminal of the pull-up transistor 214 is connected to a pull-up bit line (PUBL_LS) signal 216 generated by the control circuit 112.

The column multiplexer 108a also includes a plurality of pull-down transistors 218 (three of which are shown, such as pull-down transistors 218a, 218b and 218c). Each of the plurality of pull-down transistors 218 is connected to a corresponding bit line signal of the plurality of bit line signals 203, as shown. According to various embodiments of the present invention, the plurality of pull-down transistors 218 are n-channel MOSFETs. A source terminal of the plurality of pull-down transistors 218 is connected to ground. A drain terminal of the plurality of pull-down transistors 218 is connected to a corresponding one of the bit line signals 203. The gate terminals of the plurality of pull-down transistors 218 receive a pull-down bit line (PDBL) signal 220 (i.e., 220a, 220b and 220c). The PDBL signal 220 is generated by an inverter circuit 222. In the drawing, three such inverters 222 are shown namely inverters 222a, 222b and 222c, which correspond to the plurality of PDBL signals 220. The plurality of inverters 222 receive the YL_LS [1:m] signal 212 as input from the column address decoder 106, and generate the plurality of PDBL signals 220.

The control circuit 112 receives a clock signal 124, a chip enable (CE) signal 126, and an address ADR [1:k] signal 128 as inputs. In one embodiment, the clock signal 124 is supplied externally to the ROM device 200. The control circuit 112 generates the row address signal 130 and the word line clock signal 132. The control circuit 112 also generates a sense amplifier enable signal (SE_LS) 224 to enable the sense amplifier 110a.

The ROM device 200 operates at the supply voltage $V_{DD}$. A read operation of the ROM device 200 is initiated by the CE signal 126. The clock signal 124 initiates a timing cycle for the read operation. A k-bit address is received on the ADR [1:k] signal 128. The ADR [1:k] signal 128 is a k-bit memory address of the ROM device 200. Thereafter, the control unit 112 generates the word line clock signal 132 based on the k bit memory address, which in turn generates a corresponding word line signal of the plurality of WL_LS signals 206. The column address decoder 106 generates the YL_LS [1:m] signal 212 to enable at least one of the plurality of bit line signals 203 in the column multiplexer 108a. The plurality of bit line signals 203 operate at the supply voltage $V_{DD}$.

The YL_LS [1:m] signal 212 is an m bit signal to enable m bit line signals of the plurality of bit line signals 202. The YL_LS [1:m] signal 212 operates at the level shifted voltage ($V_{DDA}$), which is required to increase strength of the corresponding transmission gate 208. The YL_LS [1:m] signal 212 is provided as input to a gate terminal of the n-channel MOSFET of a corresponding transmission gate 208. Operation of the YL_LS [1:m] signal 212 at the level shifted voltage $V_{DDA}$ increases the drive strength at the gate terminal of the transmission gate 208.

The PUBL_LS signal 216 and the SE_LS signal 224 also operate at the level shifted voltage $V_{DDA}$ to synchronize with the YL_LS [1:m] signal 212. The level shifted voltage $V_{DDA}$ is greater than the $V_{DD}$.

The control circuit 112 determines the plurality of bit line signals 202 to be enabled. Thereafter, the control circuit 112 generates the PUBL_LS signal 216 to pre-charge the plurality of bit line signals 203. The PUBL_LS signal 216 is initially at 0 volt, which enables the gate terminal of the pull-up transistor 214. The plurality of bit line signals 203 start pre-charging and a voltage of the plurality of bit line signals 203 increases. When the plurality of bit line signals 203 are pre-charged to a first predefined threshold voltage, the control circuit 112 increases the voltage of the PUBL_LS signal 216 to the level shifted voltage $V_{DDA}$. In one embodiment of the present invention, the first predefined threshold voltage is 95% of $V_{DD}$. The gate terminal of the pull-up transistor 214 is disabled and the pre-charging of the plurality of bit line signals 202 stops.

Thereafter, the control circuit 112 generates the row address signal 130 based on the ROM address received on the ADR [1:k] signal 128. The row address signal RA 130 enables the XDEC 104. At least one of the plurality of WL_LS signals 206 is selected by the XDEC 104 based on the row address signal 130. The plurality of WL_LS signals 206 operate at the level shifted voltage $V_{DDA}$, which enables the current through the gate terminal of the plurality of bit cells 204 and increases a rate of discharge of the plurality of bit line signals 203. The increased rate of discharge reduces the read time of the ROM device 200.

The operation of the YL_LS [1:m] signal 212 at the level shifted voltage $V_{DDA}$ strengthens the NMOSFET of the corresponding transmission gate 208, which also contributes to reducing the read time of the ROM device 200. Thereafter, the control circuit 112 generates the SE_LS signal 224 to enable the sense amplifier 110a. The SE_LS signal 224 operates at the level shifted voltage $V_{DDA}$ to synchronize with the PUBL_LS signal 216 and YL_LS [1:m] signal 212.

The sense amplifier 110a senses data stored in a bit cell 204 corresponding to the enabled plurality of bit line signals 203 and the selected plurality of WL_LS signals 206. Subsequently, the sense amplifier 110a performs the read operation. The data read by the sense amplifier 110a is output as Data Out$_1$. Subsequently, an inverter 222 corresponding to the enabled bit line signal inverts the YL_LS [1:m] signal 212 generates the PDBL signal 220. The PDBL signal 220 is provided to the gate terminal of a corresponding pull-down transistor of the plurality of pull-down transistors 218. The PDBL signal 220 operates at the level shifted voltage $V_{DDA}$, and discharges the enabled bit line signal. Operation of the PDBL signal 220 at the level shifted voltage $V_{DDA}$ also increases the rate of discharge and subsequently reduces cycle time of the ROM device 200. The ROM device 200 finally reverts to a standby state before the start of a subsequent read operation.

The PDBL signal 220 is also provided as input to a gate terminal of a p-channel metal oxide transistor field effect transistor (p-channel MOSFET) of the plurality of transmission gates 208. When a corresponding bit cell of the plurality of bit cells 204, connected to the enabled bit line signal 203 stores a logic 1 value, the enabled bit line signal 203 continues to be at logic 1. However, when the corresponding bit cell 204 stores a logic 0 value, the enabled bit line signal 203 discharges at a fast rate. The faster discharge of the enabled bit line signal 203 reduces the voltage of the enabled bit line signal 203 faster. Subsequently, a voltage drop at the BLM node 210 and a voltage drop at an input of the sense amplifier 110a are increased, which reduces the read time. Subsequently, the row address signal 130 is disabled, which disables the selected one of the plurality of WL_LS signals 206.

Operation of the YL_LS [1:m] signal 212, PUBL_LS signal 216, and SE_LS signal 224 allows better tracking of signals inside the ROM device 200, and achieves better timing. The tracking of the signals enables synchronization in timing of the YL_LS [1:m] 212, PUBL_LS 216 and SE_LS 224 signals. Further, the tracking of the aforesaid signals is essential for optimizing the read time of the ROM device 200.

Figure 3:
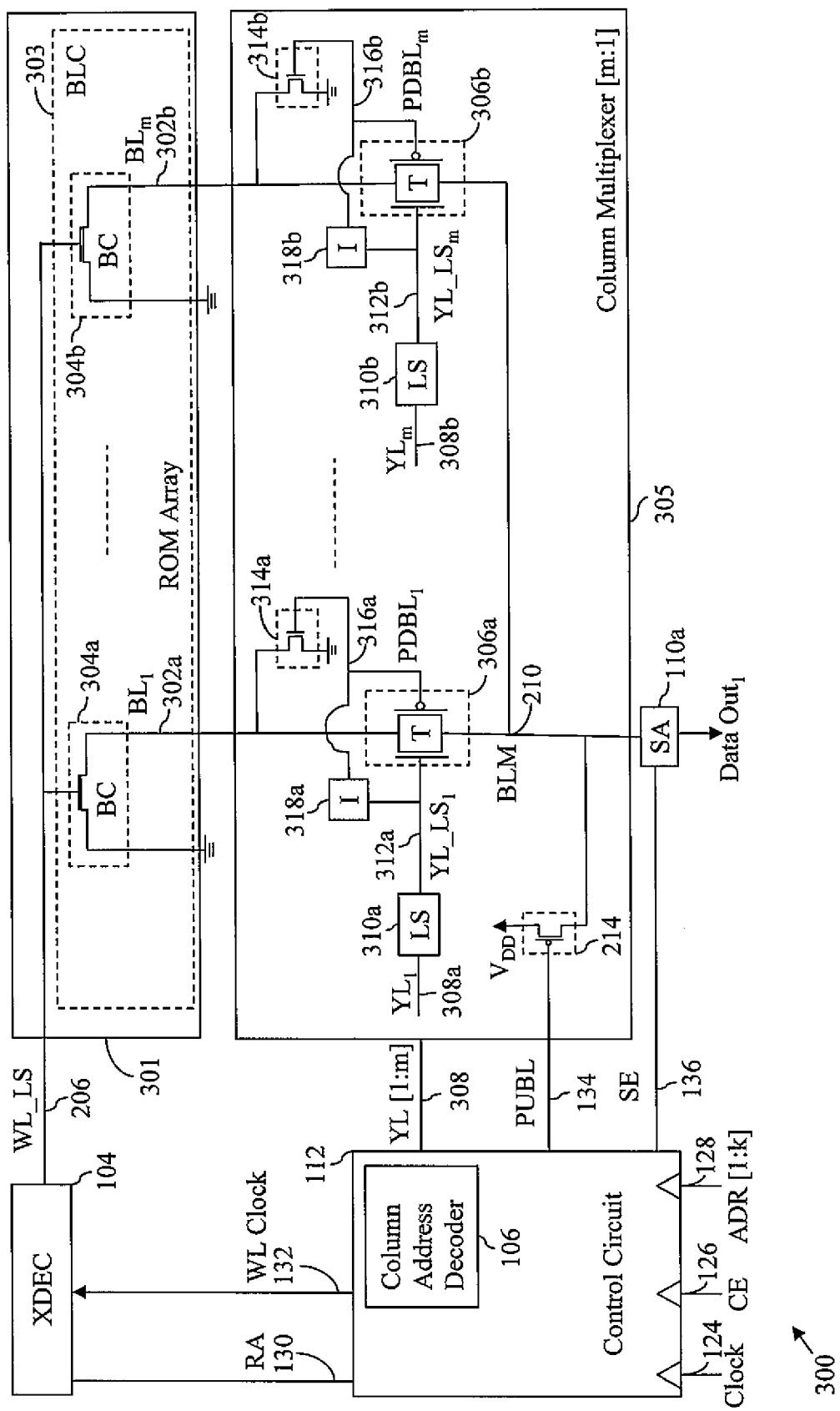
FIG. 3 is a detailed schematic block diagram of a ROM device in accordance with another embodiment of the present invention.

Referring now to FIG. 3, a detailed block diagram illustrating a Read Only Memory (ROM) device 300 in accordance with another embodiment of the present invention is shown. The ROM device 300 includes a ROM array 301, the row address decoder (XDEC) 104, the column address decoder 106, a column multiplexer 305, the sense amplifier 110a and the control circuit 112.

The ROM array 301 includes a bit line column (BLC) 303. The BLC 303 is connected to a plurality of bit line signals 302a and 302b (referred to as 302). Further, the BLC 303 includes a plurality of bit cells 304a and 304b (referred to as 304). The plurality of bit cells 304 store binary data (logic 1 or logic 0).

In various embodiments of the present invention, each of the bit cells 304 is a NMOS transistor. A source terminal of each of the plurality of bit cells 304 is connected to ground. When the plurality of bit cells 304 store a logic 0 value, a drain terminal of the plurality of bit cells 304 is connected to a corresponding bit line signal 302a or 302b of the plurality of bit line signals 302. However, when the plurality of bit cells 304 store a logic 1 value, the drain terminal is not connected to the corresponding bit line signal 302. A gate terminal of each of the plurality of bit cells 304 is connected to a plurality of word line (WL_LS) signals 206. The WL_LS signals 206 are generated by the XDEC 104 on receiving a row address signal 130, and a word line clock signal 132 as input from the control circuit 112.

The column multiplexer 305 includes a plurality of CMOS transmission gates 306a and 306b (referred to as 306). An input of the plurality of transmission gates 306 is connected to the plurality of bit line signals 302. The plurality of bit line signals 302 operate at a low supply voltage $V_{DD}$. An output of the plurality of transmission gates 306 is connected to the BLM node 210. A gate terminal of an NMOS (n-channel MOSFET) of the plurality of transmission gates 306 receives a YL [1:m] signal 308 as input from the column address decoder 106. The YL [1:m] signal 308 is an m bit column address signal. Each of the m bits of the YL [1:m] signal 308 (e.g., YL$_1$ 308a and YL$_m$ 308b) is supplied to a level shifter circuit 310 (e.g., LS 310a and LS 310b). The level shifter circuit 310 includes one or more buffers for buffering the YL [1:m] 308 signal. Each of the one or more buffers also inverts a corresponding input signal. An output of the level shifter circuit 310 is a level shifted column address signal (YL_LS) 312.

The YL_LS 312 (e.g., YL_LS$_1$ 312a, YL_LS$_m$ 312b) are supplied to a gate terminal of the n-channel MOSFET of a corresponding transmission gate of the plurality of transmission gates 306. The column multiplexer 305 also includes the pull-up transistor 214 to pre-charge the plurality of bit line signals 302. According to various embodiments of the present invention, the pull-up transistor 214 is a MOSFET that operates at the supply voltage $V_{DD}$. A drain terminal of the pull-up transistor 214 is connected to the BLM node 210, a source terminal is connected to the supply voltage $V_{DD}$, and a gate terminal is connected to the pull-up bit line (PUBL) signal 134 generated by the control circuit 112.

The column multiplexer 305 also includes a plurality of pull-down transistors 314 (e.g., pull-down transistor 314a and pull-down transistor 314b). Each of the plurality of pull-down transistors 314 is connected to a corresponding bit line signal of the plurality of bit line signals 302. According to various embodiments of the present invention, the plurality of pull-down transistors 314 are NMOS transistors. A source terminal of the plurality of pull-down transistors 314 is connected to ground, a drain terminal is connected to a corresponding bit line signal of the plurality of bit line signals 302, and a gate terminal receives is connected to the pull-down bit line (PDBL) signal 316. The PDBL signal 316 is generated by an inverter circuit 318. That is, a plurality of inverters 318a and 318b correspond to the plurality of PDBL signals 316. The plurality of inverters 318 receive the YL_LS signal 312 as input from the level shifter circuit 310, and generate the plurality of PDBL signals 316. Each of the plurality of PDBL signals 316 (e.g., PDBL₁ 316a and PDBL_m 316b) corresponds to one of the pull-down transistors 314.

The control circuit 112 receives a clock signal 124, a chip enable (CE) signal 126, and an ADR [1:k] signal 128 as inputs. The clock signal 124 is supplied externally to the ROM device 300. The control circuit 112 generates the row address signal 130 and the word line clock signal 132. Further, the control circuit 112 generates a sense amplifier enable signal (SE) 136 to enable the sense amplifier 110a.

The ROM device 300 operates at the supply voltage $V_{DD}$. A read operation of the ROM device 300 is initiated by the CE signal 126. The CE signal 126 enables the ROM device 300. The clock signal 124 initiates timing cycle for the read operation. A k bit address is received as the ADR [1:k] signal 128. Thereafter, the control unit 112 generates the word line clock signal 132 based on the k bit memory address. This initiates a corresponding word line signal of the plurality of WL_LS 206. The column address decoder 106 generates the YL [1:m] signal 308 to enable at least one of the plurality of bit line signals 302 in the column multiplexer 108a. The plurality of bit line signals 302 operate at the supply voltage $V_{DD}$. The YL [1:m] signal 308 is an m bit signal to enable m bit line signals of the plurality of bit line signals 302.

The YL [1:m] signal 308 is provided to the level shifter circuit 310. The level shifter circuit 310 includes a plurality of buffers that increase a voltage of the YL [1:m] signal 308 from the supply voltage $V_{DD}$ to a level shifted voltage ($V_{DDA}$) that is higher than the supply voltage $V_{DD}$. An output of the level shifter circuit 310 is the YL_LS signal 312. The YL_LS signal 312 operates at $V_{DDA}$ in order to increase the strength of a corresponding transmission gate of the plurality of transmission gates 306. The YL_LS signal 312 is provided as input to a gate terminal of the NMOS of a corresponding transmission gate 306. Operation of the YL_LS signal 312 at $V_{DDA}$ strengthens the signal at the gate terminal of the NMOS of the corresponding transmission gate 306.

The control circuit 112 also determines the plurality of bit line signals 302 to be enabled. Thereafter, the control circuit 112 generates the PUBL signal 134 to pre-charge the plurality of bit line signals 302. The PUBL signal 134 is initially at 0.0v. This enables the gate terminal of the pull-up transistor 214. The plurality of bit line signals 302 start pre-charging and a voltage of the plurality of bit line signals 302 increases. When the plurality of bit line signals 302 are pre-charged to a first predefined threshold voltage, the control circuit 112 increases the voltage of the PUBL signal 134 to $V_{DD}$. In an embodiment of the present invention, the first predefined threshold voltage is 95% of $V_{DD}$. The gate terminal of the pull-up transistor 214 is disabled and the pre-charging of the plurality of bit line signals 302 stops.

Thereafter, the control circuit 112 generates the row address signal 130 based on the ROM address received on the ADR [1:k] signal 128. The row address signal 130 enables the XDEC 104. At least one of the plurality of WL_LS signals 206 is selected by the XDEC 104 based on the row address signal 130. The plurality of WL_LS signals 206 operate at the level shifted voltage $V_{DDA}$. This enables the current through the gate terminal of the plurality of bit cells 304 and increases a rate of discharge of the plurality of bit line signals 302. The increased rate of discharge reduces the read time of the ROM device 300.

The read time of the ROM device 300 is less than the read time of the ROM device 200. The operation of the YL_LS signal 312 at $V_{DDA}$ strengthens the NMOSFET of the corresponding transmission gate 306, which further reduces the reading time of the ROM device 300. Thereafter, the control circuit 112 generates the SE signal 136 to enable the sense amplifier 110a. The sense amplifier 110a senses the data stored in a bit cell corresponding to the enabled plurality of bit line signals 302 and the selected plurality of WL_LS signals 206. Subsequently, the sense amplifier 110a performs the read operation. The data read by the sense amplifier 110a is output as Data Out₁.

Subsequently, an inverter corresponding to the enabled bit line signal inverts the YL_LS signal 312 and generates the PDBL signal 316. The PDBL signal 316 is provided to the gate terminal of a corresponding pull-down transistor of the plurality of pull-down transistors 314. The PDBL signal 316 operates at $V_{DD}$, and discharges the enabled bit line signal. The PDBL signal 316 is also provided as input to a gate terminal of a PMOS transistor of the plurality of transmission gates 306. When a corresponding bit cell of the plurality of bit cells 304, connected to the enabled bit line signal stores logic 1 value, the enabled bit line signal continues to be at logic value. However, when the corresponding bit cell stores logic 0 value, the enabled bit line signal discharges at a fast rate. The faster discharge of the enabled bit line signal reduces the voltage of the enabled bit line signal in a reduced time. Subsequently, a voltage drop at the BLM node 210 and a voltage drop at an input of the sense amplifier 110a are increased. This reduces the read time. Subsequently, the row address signal 130 is disabled, which disables the selected one of the plurality of WL_LS signals 206.

Figure 4:
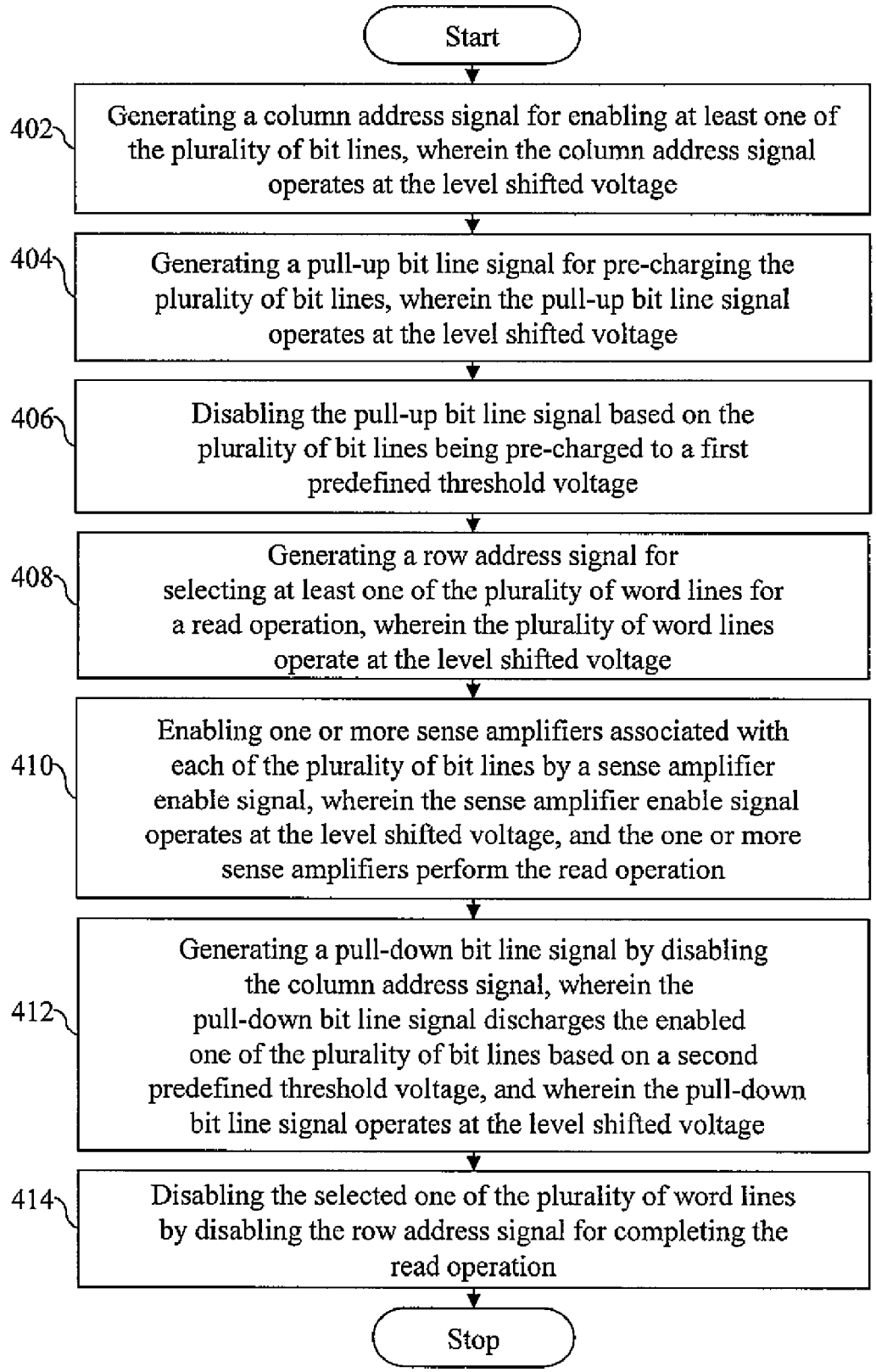
FIG. 4 is a flow chart illustrating a method for operating a ROM device in accordance with an embodiment of the present invention.

Referring now to FIG. 4, a flow chart illustrating a method for operating the ROM device 200 in accordance with an embodiment of the present invention is shown.

The method starts at step 402, where the column address decoder 106 generates the YL_LS [1:m] signal 212 for enabling at least one of the plurality of bit line signals 203. The plurality of bit lines signals 203 operate at the supply voltage $V_{DD}$. The YL_LS [1:m] signal 212 operates at the level shifted voltage $V_{DDA}$, which is higher than $V_{DD}$. Also, as discussed below, the word line signal WL_LS 206 and the pull down bit line PDBL signal also operate at the level shifted voltage $V_{DDA}$.

At step 404, the control circuit 112 generates a PUBL_LS signal 216 to pre-charge the plurality of bit line signals 202 to a first predefined threshold voltage. In an embodiment of the present invention, the first predefined threshold voltage is 95% of the $V_{DD}$. The PUBL_LS signal 216 operates at the level shifted voltage $V_{DDA}$.

At step 406, a voltage of the enabled bit line signal 203 is determined. When the enabled plurality of bit line signals 203 are pre-charged to the first predefined threshold voltage, the control circuit 112 disables the enabled plurality of bit line signals 203.

At step 408, the control circuit 112 generates the row address signal 130 for selecting at least one of the plurality of WL_LS signals 206 for a read operation. The plurality of WL_LS signals 206 operate at the $V_{DDA}$.

At step 410, the control circuit 112 enables the one or more sense amplifiers 110 associated with each of the plurality of bit line signals 203 by the SE_LS signal 224. The SE_LS signal 224 operates at the level shifted voltage $V_{DDA}$. The one or more sense amplifiers 110 sense the data to be read and perform the read operation.

At step 412, the plurality of inverters 222 receive the YL_LS [1:m] signal 212 as input and generate the PDBL signal 220 by disabling the YL_LS [1:m] signal 212. The PDBL signal 220 operates at the level shifted voltage $V_{DDA}$ and discharges the enabled plurality of bit line signals 203.

At step 414, the control circuit 112 disables the row address signal 130. Subsequently, the XDEC 104 disables the selected plurality of WL_LS signals 206.

The method for operating the ROM device 200 is complete at step 414.

While various embodiments of the present invention have been illustrated and described, it will be clear that the present invention is not limited to these embodiments only. Numerous modifications, changes, variations, substitutions, and equivalents will be apparent to those skilled in the art, without departing from spirit and scope of the present invention, as described in the claims.

The invention claimed is:

1. A Read Only Memory (ROM) device operating at a supply voltage, comprising:
   a ROM array including a plurality of bit line columns connected to a plurality of bit lines, each of the plurality of bit line columns comprising a plurality of bit cells, wherein a gate terminal of each of the plurality of bit cells is connected to a plurality of word lines, and wherein the plurality of word lines operate at a level shifted voltage that is higher than the supply voltage;
   a row address decoder connected to the ROM array, wherein for a read operation, the row address decoder selects at least one of the plurality of word lines;
   a column address decoder connected to the plurality of bit lines, wherein for the read operation, the column address decoder generates a column address signal for enabling at least one of the plurality of bit lines, and wherein the column address signal operates at the level shifted voltage;
   one or more sense amplifiers connected to the plurality of bit lines for sensing the plurality of bit lines;
   one or more column multiplexers connected to the plurality of bit line columns, wherein the one or more column multiplexers comprise:
      a plurality of transmission gates connected to the plurality of bit lines for transferring data stored in the plurality of bit cells to the one or more sense amplifiers, wherein the column address signal is supplied to a gate terminal of an n-channel metal oxide semiconductor field effect transistor (n-MOSFET) of the plurality of transmission gates;
      an inverter circuit for receiving the column address signal and generating a pull-down bit line signal to discharge the at least one enabled bit line, wherein the pull-down bit line signal operates at the level shifted voltage; and
   a control circuit connected to the row address decoder, the one or more column multiplexers, and the one or more sense amplifiers, wherein the control circuit generates a pull-up bit line signal for pre-charging the plurality of bit lines, wherein the pull-up bit line signal operates at the level shifted voltage, and generates a sense amplifier enable signal for enabling the one or more sense amplifiers, wherein the sense amplifier enable signal operates at the level shifted voltage, and the one or more sense amplifiers perform the read operation.

2. The ROM device of claim 1, wherein the control circuit generates a row address signal for enabling the row address decoder.

3. The ROM device of claim 1, wherein the inverter circuit comprises one or more inverters.

4. The ROM device of claim 1, wherein each of the one or more column multiplexers comprises a pull-up transistor connected to the plurality of bit lines and wherein the pull-up bit line signal is provided to a gate terminal of the pull-up transistor for pre-charging the plurality of bit lines.

5. The ROM device of claim 4, wherein the pull-up transistor is a p-channel metal oxide semiconductor field effect transistor (PMOSFET).

6. The ROM device of claim 1, wherein each of the one or more column multiplexers comprises a pull-down transistor connected to a corresponding bit line of the plurality of bit lines and the control circuit, and wherein the pull-down bit line signal is provided to a gate terminal of the plurality of pull-down transistors for discharging the enabled one of the plurality of bit lines.

7. The ROM device of claim 6, wherein the pull-down transistor is a NMOSFET.

8. A Read Only Memory (ROM) device operating at a supply voltage, comprising:
   a ROM array including a plurality of bit line columns connected to a plurality of bit lines, each of the plurality of bit line columns comprising a plurality of bit cells, wherein a gate terminal of each of the plurality of bit cells is connected to a plurality of word lines, and wherein the plurality of word lines operate at a level shifted voltage that is higher than the supply voltage;
   a row address decoder connected to the ROM array, wherein for a read operation, the row address decoder selects at least one of the plurality of word lines;
   a column address decoder connected to the plurality of bit lines, wherein for the read operation, the column address decoder generates a column address signal for enabling at least one of the plurality of bit lines, and wherein the column address signal operates at the level shifted voltage;
   one or more sense amplifiers connected to the plurality of bit lines for sensing the plurality of bit lines;
   one or more column multiplexers connected to the plurality of bit line columns, wherein the one or more column multiplexers comprise:
      a plurality of transmission gates connected to the plurality of bit lines for transferring data stored in the plurality of bit cells to the one or more sense amplifiers, wherein the column address signal is supplied to a gate terminal of an n-channel metal oxide semiconductor field effect transistor (NMOSFET) of the plurality of transmission gates;
      an inverter circuit for receiving the column address signal and generating a pull-down bit line signal to discharge the at least one enabled bit line; and
   a control circuit connected to the row address decoder, the one or more column multiplexers, and the one or more sense amplifiers, wherein the control circuit generates a pull-up bit line signal for pre-charging the plurality of bit lines, and generates a sense amplifier enable signal for enabling the one or more sense amplifiers, the one or more sense amplifiers performing the read operation.

9. The ROM device of claim 8, wherein at least one of the pull-down bit line signal, the pull-up bit line signal and the sense amplifier enable signal operate at the level shifted voltage.

10. The ROM device of claim 8, wherein the control circuit generates a row address signal for enabling the row address decoder.

11. The ROM device of claim 8, wherein the inverter circuit comprises one or more inverters.

12. The ROM device of claim 8, wherein each of the one or more column multiplexers comprises a pull-up transistor connected to the plurality of bit lines and wherein the pull-up bit line signal is provided to a gate terminal of the pull-up transistor for pre-charging the plurality of bit lines.

13. The ROM device of claim 12, wherein the pull-up transistor is a p-channel metal oxide semiconductor field effect transistor (p-MOSFET).

14. The ROM device of claim 8, wherein each of the one or more column multiplexers comprises a pull-down transistor connected to a corresponding bit line of the plurality of bit lines and the control circuit, and wherein the pull-down bit line signal is provided to a gate terminal of the plurality of pull-down transistors for discharging the enabled one of the plurality of bit lines.

15. The ROM device of claim 14, wherein the pull-down transistor is the n-MOSFET.

16. A method for operating a Read Only Memory (ROM) device, the ROM operating at a supply voltage and including a ROM array, the ROM array including a plurality of bit line columns connected to a plurality of bit lines, each of the plurality of bit line columns comprising a plurality of bit cells, wherein a gate terminal of each of the plurality of bit cells is connected to a plurality of word lines, the method comprising the steps of:
  generating a column address signal for enabling at least one of the plurality of bit lines, wherein the column address signal operates at a level shifted voltage that is higher than the supply voltage;
  generating a pull-up bit line signal for pre-charging the plurality of bit lines, wherein the pull-up bit line signal operates at the level shifted voltage;
  disabling the pull-up bit line signal based on the plurality of bit lines being pre-charged to a first predefined threshold voltage;
  generating a row address signal for selecting at least one of the plurality of word lines for a read operation, wherein the plurality of word lines operate at the level shifted voltage;
  enabling one or more sense amplifiers associated with each of the plurality of bit lines by a sense amplifier enable signal, wherein the sense amplifier enable signal operates at the level shifted voltage, and the one or more sense amplifiers perform the read operation;
  generating a pull-down bit line signal by disabling the column address signal, wherein the pull-down bit line signal discharges the enabled one of the plurality of bit lines, and wherein the pull-down bit line signal operates at the level shifted voltage; and
  disabling the selected one of the plurality of word lines by disabling the row address signal for completing the read operation.

17. The method for performing a read operation in a ROM device of claim 16, wherein disabling the column address signal comprises inverting the column address signal for completing the read operation.

18. The method for performing a read operation in a ROM device of claim 16, further comprising providing the pull-up bit line signal to a gate terminal of a pull-up transistor for pre-charging the plurality of bit lines to the supply voltage.

19. The method for performing a read operation in a ROM device of claim 16, further comprising providing the pull-down bit line signal to a gate terminal of a pull-down transistor for discharging the plurality of bit lines.

* * * * *